United States Patent [19]

Swanson

[11] Patent Number: 4,510,456

[45] Date of Patent: Apr. 9, 1985

[54] PDM AMPLIFIER HAVING DISTORTION REDUCTION CIRCUIT

[75] Inventor: Hilmer I. Swanson, Quincy, Ill.

[73] Assignee: Harris Corporation, Melbourne, Fla.

[21] Appl. No.: 536,783

[22] Filed: Sep. 28, 1983

[51] Int. Cl.³ .............................................. H03F 3/38
[52] U.S. Cl. ....................................... 330/10; 330/149
[58] Field of Search .............................. 330/3, 10, 149

[56] References Cited

U.S. PATENT DOCUMENTS

| | | | |
|---|---|---|---|
| 4,004,246 | 1/1977 | Hamada | 330/10 |
| 4,122,415 | 10/1978 | Luther, Jr. et al. | 332/37 R |
| 4,140,980 | 2/1979 | Cummings | 332/9 T |
| 4,164,714 | 8/1979 | Swanson | 330/10 |

Primary Examiner—James B. Mullins
Assistant Examiner—Steven J. Mottola
Attorney, Agent, or Firm—Yount & Tarolli

[57] ABSTRACT

A pulse duration modulator (PDM) provides a train of pulses at a fixed repetition rate and a fixed amplitude but of a pulse width dependent upon an input signal. A switching transistor receives this pulse and is turned on for a duration dependent on the pulse width. The output circuit of the transistor is connected to a load for receiving an amplified version of the pulse train. Stray capacitance across the output circuit causes distortion in the amplified pulse particularly when the switch on time is less than the off time. A distortion reduction circuit is connected to the output circuit for inserting or increasing the current flowing to the output circuit to more rapidly charge the stray capacitance and thereby reduce distortion.

14 Claims, 4 Drawing Figures

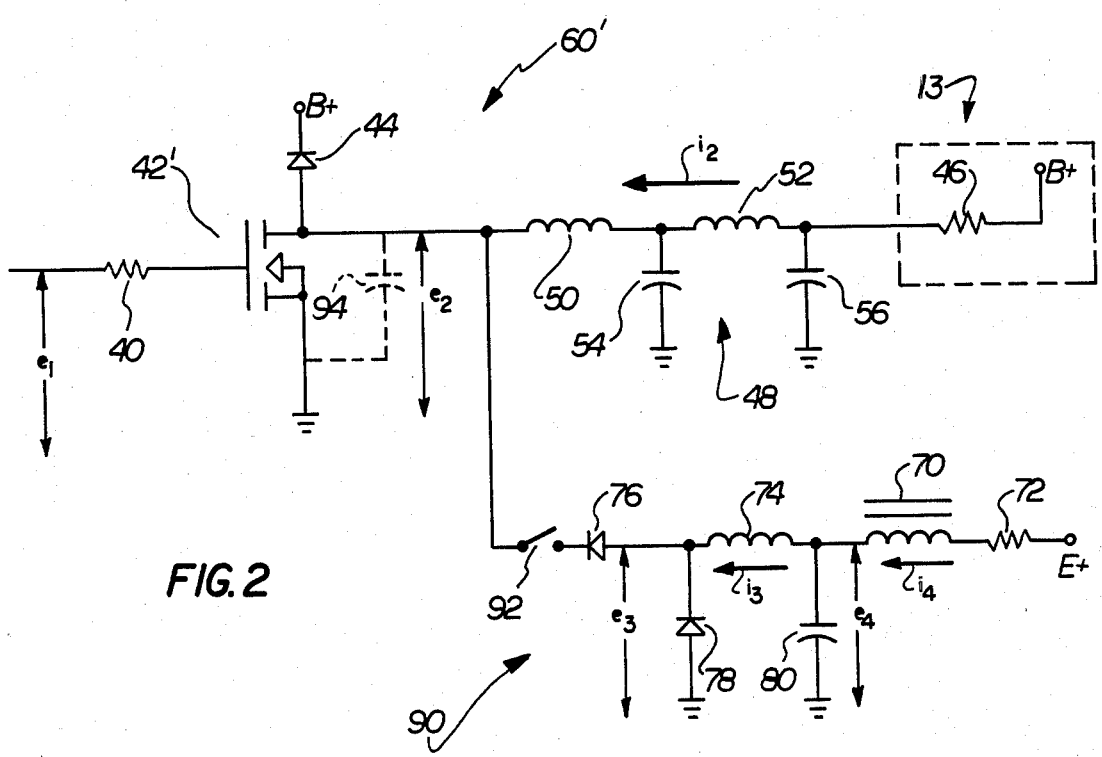
FIG.2
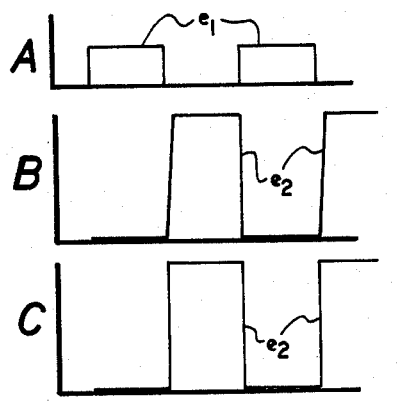
FIG.3
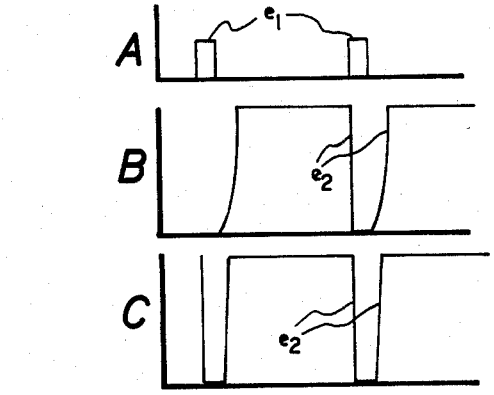
FIG.4
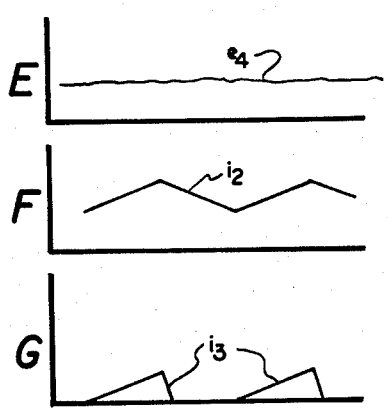
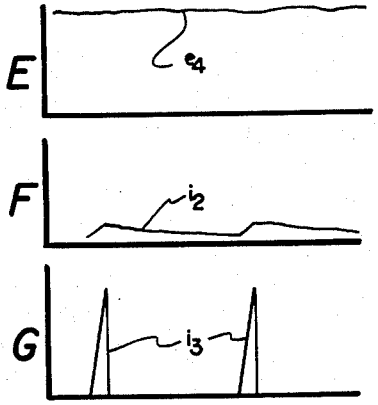

PDM AMPLIFIER HAVING DISTORTION REDUCTION CIRCUIT

BACKGROUND AND FIELD OF THE INVENTION

This invention relates to the art of amplifiers and, more particularly, to improvements to polyphase pulse duration modulation (PDM) amplifiers to achieve distortion reduction.

Although the invention will be described herein with particular reference to a modulator circuit for an RF transmitter, it is to be appreciated that the invention has broader applications and may be used in conjunction with signal amplification in other areas such as high fidelity audio systems and public address systems, etc.

In order to achieve efficiency of operation in power amplifiers, pulse duration modulation (PDM) is frequently employed. In such amplifiers an input signal, such as an audio signal, is used to pulse modulate a carrier signal, and the resulting PDM signal is amplified. The amplified PDM signal is then filtered to recover a demodulated signal corresponding to an amplified version of the input audio signal.

A polyphase PDM amplifier is disclosed in U.S. Pat. No. 4,164,714 to H. Swanson and assigned to the assignee herein. That patent discloses a system wherein an amplified signal is formed by combining the outputs of plural parallel-connected PDM amplifiers. All of the amplifiers respond to a common input signal, but have differently phased carrier signals. Polyphase PDM amplifiers of this type enjoy various advantages over earlier, single phase PDM amplifiers. For example, amplifier elements employed in polyphase PDM amplifiers operate at relatively low switching frequencies and power levels, permitting semiconductor devices to be used as the active amplifier elements instead of vacuum tube devices.

The switching frequencies at which the PDM amplifiers operate serve to drive a switching device such as a semiconductor so as to generate a train of square-wave pulses of fixed magnitude but of variable pulse width in dependence on the on-off time durations of the semiconductor switching device. This is followed by a filter stage used in recovering the amplified audio signal from the pulse duration modulated signal. The Swanson patent, supra, employs a semiconductor switch and a series connected filtering stage for each PDM amplifier. These are connected in parallel and serve as a combiner in recovering the amplified audio signal during which the frequency component corresponding to the switching signal is removed without significantly effecting the frequency spectrum of the audio component. This combined signal is then supplied to a load in the form of an RF modulator for modulating a carrier signal from an oscillator for transmission purposes. It has been found, however, that the effective capacitance of each semiconductor switching device will cause distortion in the square-wave signal in each stage if the width of the driving pulse is narrow. Thus, in such a system, the current passing through the filter stage will be very small during this time resulting in a much slower charging of the effective capacitance than when the width of the PDM pulse is much wider (longer on time).

SUMMARY OF THE INVENTION

It is an object of the present invention to provide such a PDM amplifier having reduced distortion.

It is a still further object to provide such reduced distortion particularly when the switch on time is less than the switch off time.

It is a still further object to achieve such distortion reduction by increasing the magnitude of current flowing to the output circuit during short switch on times so as to more rapidly charge the stray capacitance.

In accordance with the invention, a pulse duration modulator supplies a train of pulses having a fixed repetition rate and a fixed amplitude but having pulse widths dependent on an input signal. A switching means is turned on for a duration corresponding with the pulse width. This switching means has an output circuit connected in series with a load to receive an amplified signal. The output circuit has stray capacitance tending to distort the amplified signal when the switch on time is less than the off time because during this condition the capacitance charges slowly. A distortion reduction means is connected to the output circuit of the switching means for inserting or increasing the current flowing to the output circuit during such a condition so as to more rapidly charge the stray capacitance.

BRIEF DESCRIPTION OF THE DRAWINGS

The foregoing and other objects and advantages of the invention will become more readily apparent from the following description of the preferred embodiment as taken in conjuction with the accompanying drawings which are part hereof and within:

FIG. 2 is a schematic illustration of a portion of one stage of a polyphase PDM amplifier employing the present invention; and FIGS. 3 and 4 are wave forms illustrating the operation of the present invention.

DESCRIPTION OF THE PREFERRED EMBODIMENT

Figure 1:
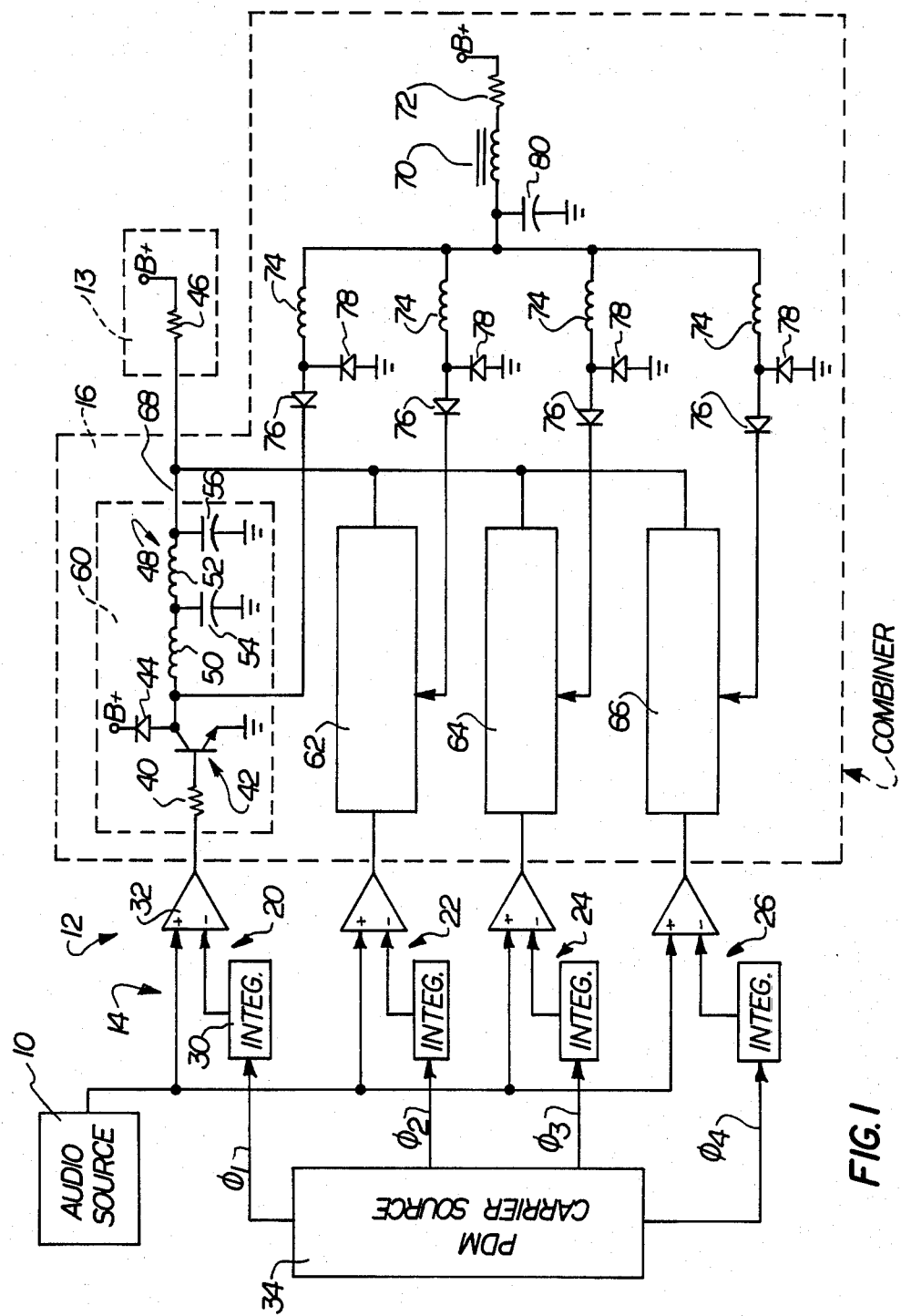
FIG. 1 is a schematic-block diagram illustration of a polyphase PDM amplifier employing the present invention.

Reference is now made to the drawings which illustrate a preferred embodiment.

FIG. 1 illustrates a polyphase PDM amplifier based on that described and illustrated in the Swanson patent, supra, but including the present invention. Specifically, FIG. 1 discloses an audio source 10 which is applied to a load 13 with amplification taking place by means of a high fidelity amplifier 12. Amplifier 12 includes a pulse duration modulator section 14 and an amplification-combiner portion 16. The modulator section 14 converts the input signal into four pulse trains which are amplified and recombined in the combiner 16. The modulator includes four pulse duration modulators 20, 22, 24 and 26. Each modulator includes an integrator 30 and a comparator 32. Each of the modulators receives the same input from the audio source 10 but receive a different phase displaced carrier signal. These carrier signals are all generated by a PDM carrier source 34 which generates four square-wave signals of common frequency but of different phase. Preferably, the four carrier frequencies are equally displaced in phase and more particularly they are displaced in phase by 90° with respect to one another. Thus, they have relative phases of 0°, 90°, 100°, and 270° as supplied respectively to modulators 20, 22, 24 and 26.

As seen in FIG. 1, all of the PDM amplifier stages are identical and only that associated with modulator 20 will be described in detail hereinafter. Each modulator is illustrated, as in the case of modulator 20, as incorporating an integrator 30 and a corresponding comparator 32. The four phase displaced square-wave pulse trains from the PDM carrier source 34 are each directed to a corresponding modulator 20, 22, 24 and 26. The integrator 30 associated with each modulator integrates the square-wave signals supplied thereto to provide a corresponding triangular-wave signal. The triangular-wave signals are each in turn directed to a comparator 32 which compares the amplitude of the triangular-wave signal with the amplitude of the signal supplied by the audio signal source 10. Results of this comparison will in each case be a PDM output signal having a phase and frequency established by the corresponding triangular-wave signal.

Since the square-wave signals which are used to generate the triangular-wave signals all operate at the same frequency, but with discrete phase delays therebetween, the pulse duration modulated outputs of comparators 32 in the respective modulators 20, 22, 24 and 26 will operate at the same frequency but with discrete phase delays therebetween. The net result will be that the audio signal of source 10 will be sampled four times during each cycle of the PDM carrier source 34.

When the input signal obtained from audio source 10 is greater in magnitude than the reference signal obtained from integrator 30, than the output of comparitor will be at a high voltage level. Conversely, when the input signal obtained from source 10 is smaller in magnitude than the reference signal, the output of the comparitor 32 will be at a low voltage level. The resulting waveforms of the output of comparator 32 will be a pulse train comprised of periodic square-wave pulses of the same magnitude but wherein the duration is modulated by the input signal. This is a PDM pulse train and the pulse trains from the different modulators will be similar but phase displaced one from the other and the pulse train from each modulator then may be characterized as a sampling of the input signal at different times from that of the other modulators.

The PDM pulse trains obtained from each modulator are supplied to the combiner 16 which provides amplification and recombination with some filtering. Thus, as seen in FIG. 1 in respect to modulator 20, the output pulse train from comparitor 32 is supplied by way of a resistor 40 to the base of an NPN transistor 42 having its emitter connected to ground and is collector connected through a diode 44 to a B+ voltage supply source. Transistor 42 is preferably a high power semiconductor which serves as a switching transistor to provide an amplified train having off time pulses dependent upon the pulse width of the received pulses from the comparitor 32. The amplification is provided by way of the B+ voltage supply source at the load 13 and the DC current path extending through resistor 46 and through a filter 48 and the collector to emitter path of transistor 42. The filter may take the form of series connected inductors 50 and 52 connected in the series DC circuit to the load 13 together with capacitors 54 and 56 connected to ground. If desired, the filter 48 may take the form of a single inductor and a single capacitor which may be a common capacitor to ground for each for the combiner circuits 60, 62, 64 and 66. The capacitors in conjuction with the inductors operate to provide the necessary filtering with the outputs being connected to a common node 68 and then to the load 13. Diode 44 in each of the circuits 60, 62, 64 and 66 serves as a clipping diode connecting the collector of the respective switching transistor with a B+ supply voltage so as to prevent excessive build-up of voltage across the corresponding switching transistor due to the inductive load. These diodes also serve to increase the efficiency of operation of the system by dumping inductor current back into the B+ power supply when the corresponding switching element turns off.

The circuit described thus far is based on that disclosed in the Swanson, supra, which is incorporated herein by reference and which may be referred to for a greater understanding of the circuitry.

During the operation of the circuitry described thus far, it has been found that the effective capacitance of the switching transistor 42 (that is the capacitance between the collector and emitter electrodes) may cause the collector to emitter voltage to be greatly distorted and, hence, that is reflected through filter 48 during times that the turn-on time of the switching transistor is quite narrow with respect to the turn-off time. Distortion results because when the turn-on time is short or narrow, the current flowing through the DC path including the filter inductors 50 and 52 is very small which causes the effective capacitance to charge very slowly. This distorts what would otherwise be a square-wave signal at the output of the switching transistor 42. This problem is discussed in greater detail hereinbelow with respect to FIG. 2 and the waveforms of FIGS. 3 and 4.

A pull-up or distortion correction circuit in accordance with the present invention serves to inject a fast rising current into the effective capacitance of the switching transistor. This current is the inverse of the charging current. Consequently, when the charging current is small, the injecting current is quite large permitting a faster charging time of the capacitor to effectively remove this distortion. The current injecting circuit which is connected to the collector of transistor 42 includes a relatively large inductor 70 having a value on the order of 2 Henries and a resistor 72 having a value on the order of 500 ohms connected in series from a B+ voltage supply source to a circuit individual to each of the switching transistors and this circuit includes a smaller inductor 74, on the order of 40 micro Henries and a series connected diode 76 to the collector of transistor 42. Thus, inductor 70 and resistor 72 serve as a constant current source. A protective diode 78 is connected to the junction between inductor 74 and diode 76 to ground. The junction of inductors 70 and 74 is connected to ground by means of a capacitor 80. This current injecting distortion correcting circuit is discussed in greater detail hereinbelow with reference to FIG. 2 and the waveforms of FIGS. 3 and 4.

Reference is now made to FIG. 2 which illustrates the combiner circuitry 60 with load 13. Here the combiner circuitry differs from that of FIG. 1 only by its inclusion of a field effect transistor 42' as opposed to the NPN transistor 42 of FIG. 1. Otherwise, the circuits are identical and the current insertion correction circuit 90 in FIG. 2 includes the same components as that of FIG. 1 with the exception that in FIG. 2 there is an inclusion of a switch 92 for purposes of illustration. The effective capacitance 94 across the semiconductor device is also included in FIG. 2 for purposes of discussion.

With switch 92 in an open position it is seen that the circuitry operates without the insertion current distortion correction circuit 90. Waveforms of FIG. 3 include FIGS. 3A through 3G. Similarly, waveforms of FIG. 4 include FIGS. 4A through 4G. The waveforms of FIGS. 3A through 3G correspond with those of FIGS. 4A through 4G but for different widths of PDM signals.

The waveforms of FIGS. 3 and 4 are taken at various points located on the circuitry of FIG. 2 and for example the waveforms of FIGS. 3A and 4A illustrate the voltage $e_1$ which is supplied as an input with reference to ground to the field effect transistor 42. The input voltage $e_1$ is shown in FIG. 3 wherein the on-time is essentially equal to the off-time, whereas in FIG. 4 the on-time is quite short compared to the off-time. Assume for the moment that switch 92 is open and that the input voltage $e_1$ corresponds with the waveform illustrated in FIG. 3A. It is seen that the pulse duration modulated input signal supplied to the switch transistor 42' has an on-duration corresponding essentially with its off-duration. When the switching transistor 42 is gated into conduction, the voltage $e_2$ taken from its source to drain electrode is essentially at ground or zero potential. When the input voltage $e_1$ is turned off the output voltage $e_2$ will rise steeply to that of the B+ voltage supply, which may be on the order of 250 volts, so that the waveform of the output voltage $e_2$ is essentially as shown in FIG. 3B. Here it should be noted that the leading edge of the waveform is not exactly vertical but is almost so that the waveform appears essentially as a square-wave showing very little if negligible distortion. This is because the current $i_2$ flowing through the filter 48 has a relatively high value during the periods of large pulse widths of the PDM signal permitting rapid charging of the effective capacitance 94.

Reference is now made to the waveforms of FIGS. 4A and 4B. Here it will be noted that the pulse width of the input voltage $e_1$ is quite narrow although the repetition rate is the same. Consequently, the off-time is much longer than the on-time. It is during this condition that distortion because of the effective capacitance 94 will be particularly noticeable. This is seen in the waveform of the output voltage $e_2$ during this period. The leading edge initially rises quite slowly and is distorted somewhat from an idealized square-wave signal. This distortion results because during such narrow pulse widths of the input signal $e_1$ the average value of current $i_2$ will be quite small compared to that given with reference to FIGS. 3A and 3B. Consequently, with a smaller value of current $i_2$ during this period this will cause the effective capacitance 94 to charge very slowly resulting in the distorted leading edge of the waveform of output voltage $e_2$ as shown in FIG. 4B.

The current insertion distortion correction circuit 90 operates to inject a current $i_3$ into the capacitance 94 which is the inverse of current $i_2$. That is, when $i_2$ is small, the insertion current $i_3$ is large. In this manner, distortion is substantially reduced as will be discussed with reference to the waveforms of FIGS. 3C through 3G and FIGS. 4C through 4G.

Considering now the operation which takes place when the input voltage $e_1$ appears as indicated in the waveform of FIG. 3A and switch 92 is closed. From FIG. 3C it is seen that the distortion on the leading edge in FIG. 3B has been substantially eliminated. This follows because with switch 92 being closed, the current insertion distortion reduction circuit serves to provide an insertion current $i_3$ (FIG. 3G). With switch 92 being closed, then upon the laging edge of voltage $e_1$ the condition is presented whereby capacitor 80 discharges somewhat providing the insertion current $i_3$ causing the narrow voltage $e_3$ to take place. This reinforces the charge current $i_2$ flowing through the effective capacitance 94 so that it quickly charges and, hence, the leading edge of the output voltage $e_2$ is essentially distortion free as is seen in FIG. 3C. A more dramatic reduction in distortion takes place particularly when the input voltage $e_1$ is of a much narrower pulse width as is seen in FIG. 4A.

Referring now to FIG. 4 and more particularly to the waveforms of FIGS. 4A and FIGS. 4C through 4G, the operation which ensues is discussed on the basis that switch 92 is closed. Because of the narrow pulse widths of voltage $e_1$ the average value of the charge current $i_2$ is substantially reduced as is seen by comparing FIG. 4F with FIG. 3F. The insertion current $i_3$ rapidly increases in magnitude so as to add to the charging current $i_2$ so as to quickly charge the effective capacitance 94. Note that from FIG. 4E that the magnitude of voltage $e_4$ rises substantially so as to maintain the average value of the insertion current $i_3$ constant.

Although the invention has been described in conjunction with a preferred embodiment it is to be appreciated that various modifications may be made without departing from the scope of the invention as defined by the appended claims.

What is claimed is:

1. An amplifier comprising:
   pulse duration modulator means for providing a train of pulses exhibiting a fixed repetition rate and a fixed amplitude and having varying widths dependent upon an input signal;
   switching means having an input circuit for receiving said pulses and being responsive thereto so that said switching means is on for a duration corresponding with the pulse width and having an output circuit connected in series with a load circuit which includes filter means for connection with a DC source so as to provide an amplified signal to said load circuit, said output circuit exhibiting stray capacitance thereacross so that said amplified signal is distorted at its leading edge relative to said pulse when the pulse on time of a said pulse is short relative to its off time causing the current flowing from said source through said load circuit to exhibit a low value delaying the charging of said stray capacitance; and
   distortion reduction means in parallel with said load circuit including current insertion means for increasing the magnitude of the current flowing to said output circuit when the on time of a said received pulse is short to more rapidly charge said stray capacitance.

2. An amplifier as set forth in claim 1 wherein said current insertion means includes a constant current source connected in series with said output circuit and a capacitor connected in parallel therewith so that said capacitor is charged from said constant current source and discharges through said stray capacitance at a rate which is inversely proportional to the width of said switch on time.

3. An amplifier as set forth in claim 2 wherein said constant current source includes a resistor and an inductor connected together in series to a direct current voltage source.

4. An amplifier as set forth in claim 3 including a second inductor connected in series between the output circuit of said switching means and said capacitor with said second inductor exhibiting an inductance substantially less than that of said inductor in said constant current source.

5. An amplifier as set forth in claim 4 wherein said load circuit includes an LC low pass filter inductance therein being substantially smaller than that of the inductance in said constant current source.

6. An amplifier as set forth in claim 1 including a plurality of said pulse duration modulator means each for receiving said input signal and providing said trains of pulses of like repetition rate and amplitude but of unlike phase.

7. An amplifier as set forth in claim 6, including a like plurality of switching means each associated with a respective one of said modulator means.

8. An amplifier as set forth in claim 7 wherein said distortion reduction means is connected in series with the output circuit of each said switching means.

9. An amplifier as set forth in claim 8 wherein said distortion reduction means includes a common current insertion means connected in series with each said output circuit for increasing the magnitude of the current flowing to more rapidly charge the stray capacitance.

10. An amplifier as set forth in claim 9, wherein said common current insertion means includes a constant current source connected in series with each said output circuit.

11. An amplifier as set forth in claim 10 wherein said common current insertion means further includes a capacitor connected in parallel with said constant current source so as to be charged therefrom and which periodically discharges through said stray capacitance.

12. An amplifier as set forth in claim 11 including plural current steering circuit means each for connecting said capacitor to one of said output circuits for steering the discharging current from said capacitor to a said output circuit.

13. An amplifier as set forth in claim 12 wherein each said steering circuit includes a diode and an inductor connected in series from said capacitor to a said output circuit.

14. An amplifier as set forth in claim 13 wherein said constant current source includes an inductor having substantially greater inductance than the inductor in each said steering circuit means.

* * * * *